United States Patent
Hellberg (10) Patent No.: US 7,711,067 B2
(45) Date of Patent: May 4, 2010

(54) BANDWIDTH-CONSTRAINED SIGNAL CONDITIONING

(75) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 540 days.

(21) Appl. No.: 11/721,620

(22) PCT Filed: Dec. 21, 2004

(86) PCT No.: PCT/SE2004/001992

§ 371 (c)(1),
(2), (4) Date: Jun. 13, 2007

(87) PCT Pub. No.: WO2006/068555

PCT Pub. Date: Jun. 29, 2006

(65) Prior Publication Data

US 2008/0025375 A1    Jan. 31, 2008

(51) Int. Cl.
*H04K 1/02* (2006.01)

(52) U.S. Cl. ...................... 375/296; 375/285

(58) Field of Classification Search ........ 375/296, 375/285
See application file for complete search history.

(56) References Cited

U.S. PATENT DOCUMENTS 6,751,266 B1 *   6/2004   Danielsons ............... 375/296

* cited by examiner

*Primary Examiner*—Kevin Y Kim
(74) *Attorney, Agent, or Firm*—Roger S. Burleigh (57) ABSTRACT

Non-linear signal conditioning is provided by signal processing in at least 2 consecutive steps (10). In each step (10) an insertion source signal (41) is provided, which is treated non-linearly to fulfil certain restrictions in bandwidth and/or spectral mask. The insertion signal is combined with a main signal (21) using a reinsertion factor ($k_1$-$k_n$), as a correction of the main signal (21). The reinsertion factor of at least one step is larger than the reinsertion factor of a previous step. In particular embodiments, the reinsertion factor increases for each of the at least 2 steps. This principle can be applied to most non-linear signal processing, and for example in PAR reduction systems, dynamic drain bias PA systems, Doherty and Chireix PA systems and in Dynamic Gate Bias systems.

36 Claims, 9 Drawing Sheets

BANDWIDTH-CONSTRAINED SIGNAL CONDITIONING

TECHNICAL FIELD

The present invention relates in general to methods and devices for non-linear signal conditioning of an alternating signal and in particular to such devices and methods where the signal has to be kept within bandwidth and/or spectral constraints.

BACKGROUND

In many applications, typically in various communications systems and especially in multi-carrier and multi-user systems, there are requests for non-linear modification of a signal. In many cases, such non-linear modifications have to be kept within a certain bandwidth or within certain spectral mask restrictions. One typical example of such non-linear modification is Peak-to-average ratio (PAR) reduction, also known as decresting or clipping. PAR reduction increases efficiency and average output power of a power amplifier (PA). The objective is to reduce the peak amplitude excursions of the output signal while keeping the spectrum expansion within specified limits, such as spectral mask and adjacent channel power ratio (ACPR) specifications, and keeping in-band error within specified limits, so-called error vector magnitude (EVM) specification.

Existing prior art solutions are mainly found in the PAR reduction area. Many different approaches have been suggested. Some locate a local amplitude maximum and insert a band-limited pulse to suppress it. Some predict the overshoot from filtering of the clipped signal and pre-compensate for it.

In the published international patent application WO 03/001697 a PAR system is disclosed. An error signal corresponding to crests of the input signal is generated and subtracted from the input signal. It is also suggested to implement multiple steps of decresting sequentially. The basic idea is very attractive and such systems do really reduce the PAR, but to achieve a good performance meeting EVM and ACPR specifications, a large number of steps have to be used. This increases the complexity of the implementation and therefore also the costs.

SUMMARY

A general problem in prior art non-linear modifications of RF signals is that it is difficult to achieve a high performance with relatively small and simple configurations. Existing solutions either use complicated prediction algorithms or have poor performance. Present 2-step solution for PAR reduction has furthermore suboptimal performance.

A general object of the present invention is to achieve improved non-linear modification of signals under bandwidth and/or spectral mask restrictions. A further object of the present invention is to provide such modifications with smaller and/or less complex systems compared to prior-art but with comparable or better performance.

The above objects are achieved by methods and devices according to the enclosed patent claims. In general words, non-linear signal conditioning is provided by signal processing in at least 2 consecutive steps. In each step an insertion signal is provided, which is treated to fulfil certain restrictions in bandwidth and/or spectral mask. The insertion signal is combined with a main signal using a reinsertion factor, as a correction of the main signal. The reinsertion factor of at least one step is larger than the reinsertion factor of a previous step.

In particular embodiments, the reinsertion factor increases for each of the at least 2 steps. This principle can be applied also to other non-linear signal processing, and for example in PAR reduction systems, Dynamic Drain Bias PA systems, Doherty and Chireix PA systems and in Dynamic Gate Bias systems.

The present invention is a general solution that can be applied to several problems that arise in various communication systems, especially multi-carrier and multi-user systems. It applies generally when a non-linear modification of a signal has to stay within bandwidth or spectral mask restrictions. The solution requires substantially fewer computations than previous solutions, and achieves high performance. It reduces the number of steps needed in a cascade of non-linear processing and filtering steps. The invention gives the performance of a many-step solution while needing only a fraction of the number of steps and hence, computations or hardware.

BRIEF DESCRIPTION OF THE DRAWINGS

The invention, together with further objects and advantages thereof, may best be understood by making reference to the following description taken together with the accompanying drawings, in which.

DETAILED DESCRIPTION

Good performance, for instance low PAR in decresting while meeting EVM and ACPR specifications, generally calls for more steps of non-linear modification and subsequent filtering of the signal, than prior art solutions use. If good performance is to be obtained by extending the prior art solutions to more steps, without further modifications, many more steps are needed.

The invention points out an alternative path, where good performance is achieved by reinserting non-linearly modified signals by a reinsertion factor larger than unity. The reinsertion factor increases for at least one subsequent step, and in particular embodiments for each subsequent step. The reinsertion factor can for example be exponentially increasing with step number, linearly increasing, or increasing by some other scheme. Any reinsertion factor is not discussed in prior art, i.e. it is always assumed to be equal to or close to one. In particular embodiments of the present invention, the first step has unity or close to unity reinsertion factor. The last step generally has a magnitude higher reinsertion factor, typically in the order of 7, but preferably at least 2.

As previously mentioned, the reinsertion factor can for example be exponentially increasing with step number, parabolic, or linearly increasing. An exact formulation is not necessary, since the reinsertion factors are usually implemented as independent multiplying factors at each step in the algorithm. Non-monotonously increasing reinsertion factors, first step reinsertion factors less than one, last step reinsertion factors less than the second last, grouped reinsertion factors may also be used, which is discussed further below.

Figure 1:
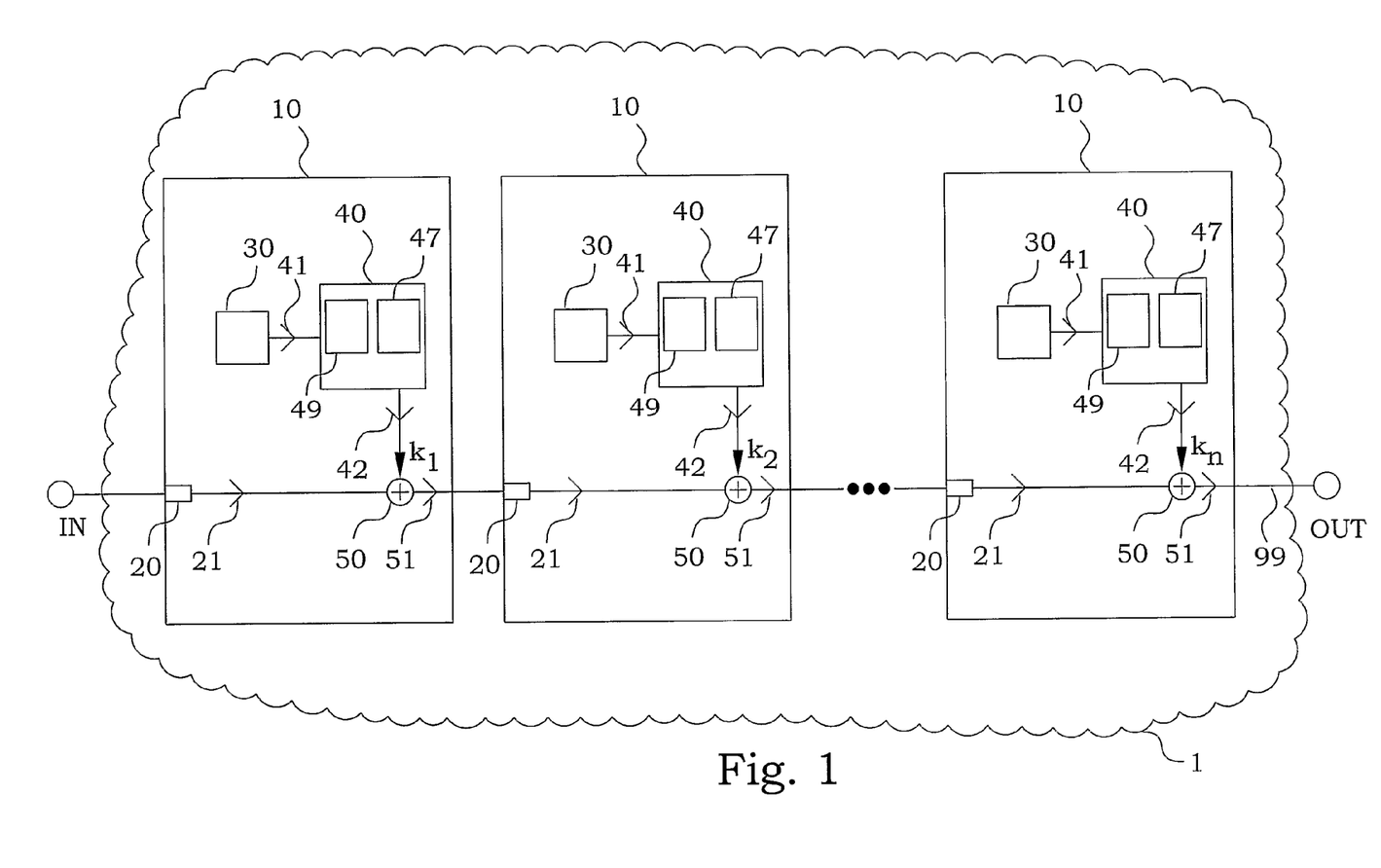
FIG. 1 is a block scheme of an embodiment of a non-linear signal conditioning device according to the present invention.

FIG. 1 illustrates an embodiment of a basic configuration according to the present invention. The setting for the concept of through the steps increasing reinsertion factor is a cascade of non-linear modifications and filtering steps. A non-linear signal modification unit 1 is provided with an input signal at an input IN and provides an output signal 99 at its output OUT. The actual non-linear signal modification takes place in a series of successive or cascaded steps 10, where the input of a subsequent step typically is equal to the output of the previous step. The non-linear modifications are generally put in the form of forcing a signal to stay within a boundary that can be constant or signal-dependent. The boundary can be one-sided or many-sided. It can also be applied on the amplitude or phase part of a polar signal. The steps 10 are typically configured in a similar manner, but may differ in the details, in particular the first and last step. In the embodiment of FIG. 1, each step 10 comprises an input 20 for an input main signal 21. In the present embodiment, this input 20 just receives the incoming signal. However, in a more general case, an input main signal providing means is present, which in the present simplest configuration corresponds to the input 20.

Each step 10 also comprises a source 30 for an insertion source signal 41. The source 30 is connected to a non-linear processing means 40. The non-linear processing means 40 generates a processed insertion signal 42 based on the insertion source signal 41. The non-linear processing means 40 typically comprises a non-linear processor 49, connected to a filter 47 reducing the bandwidth. This non-linear processor 49 thus typically comprises different constraints in amplitude and/or phase of the insertion source signal 41. The bandwidth-restricting filter 47 filters the non-band-limited insertion signal into a filtered signal—the processed insertion signal 42. The processed insertion signal 42 is then combined with the main signal 21 for producing an output signal 51 of the step 10. Such combination is illustrated in the present embodiment by an adder 50. The combined signal, i.e. the output signal 51 is typically closer to the output signal 99 than the input main signal 21. However, due to the filtering process implying the bandwidth constraints on the insertion signal, a smaller difference will typically still be present.

According to the present invention, the combining is performed using a certain reinsertion factor $k_1, k_2, \ldots, k_n$. At least one of these reinsertion factors is larger than the previous reinsertion factor. In particular embodiments, the reinsertion factor increases for each subsequent step. An example collection of reinsertion factors for a four-step system can e.g. be $k_1=1.3$, $k_2=1.8$, $k_3=2.7$, $k_4=4$. In order to have substantial impact on the convergence, at least one re-insertion factor should preferably be larger than 2. The number of steps and the sizes of reinsertion factors depend on the bandwidths of the signals and filters, the required accuracy of the output and other factors whose combinations are too numerous to list here. They must typically be elaborated for the problem at hand. However, such elaboration falls within the knowledge of anyone skilled in the art.

Figure 7:
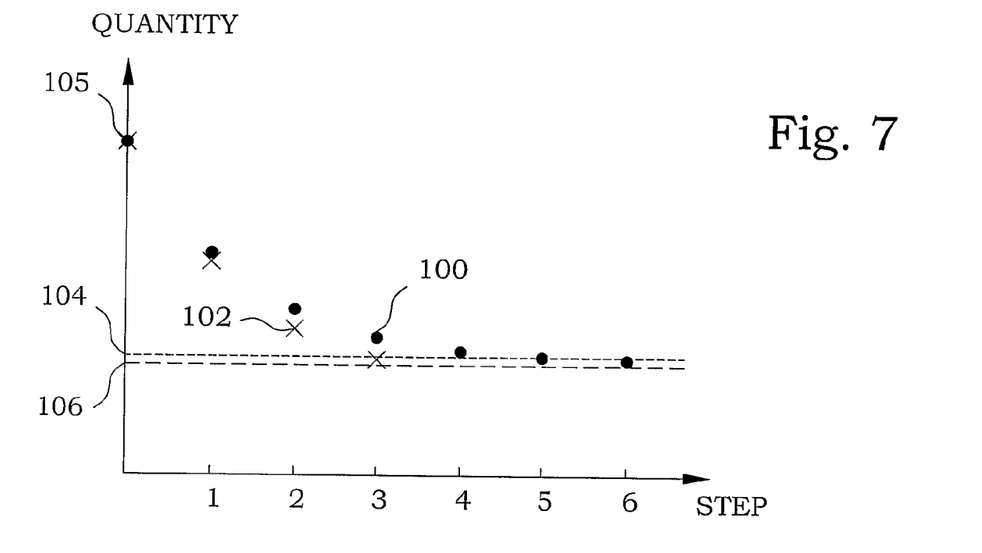
FIG. 7 is a diagram illustrating the convergence of typical non-linear signal conditioning devices.

The use of non-unity reinsertion factors and in particular increasing reinsertion factors has typically a remarkable effect of the convergence of signal modification. In FIG. 7, a diagram illustrates the development of a signal during successive steps. In a prior art multi-step system using unity reinsertion factors, a typical evaluation of a certain critical signal quantity may be as indicated by the filled circles 100. At the start, the signal quantity has a certain value corresponding to a level 105. During subsequent treatment steps e.g. according to the ideas presented in WO 03/001697, the signal quantity changes. After an infinite number of steps, the signal quantity is expected to be equal to the level indicated by the broken line 106. If an acceptable level of the signal quantity is set to the level indicated by the broken line 104, there is a need for a number of treatment steps, before the requirements are met. In this example, 6 steps are necessary to meet the requirements of level 104.

In FIG. 7, a number of crosses 102 are illustrated, which are intended to illustrate the corresponding behaviour for an embodiment of a system according to the present invention. In the first step, a reinsertion factor of 1.2 is used. For step 2 and 3, increasing reinsertion factors larger than 1.2 are used. Even if the non-unity reinsertion factors in general will introduce somewhat degraded signal quality, such effects are small compared with the benefits of reaching a faster agreement with the requested level of the signal quality. In the embodiment of FIG. 7, the embodiment of the invention will reach acceptable levels already after 3 steps, i.e. just half the number of steps compared with prior art.

A large advantage with the present invention is a large reduction in computational cost. The number of steps of non-linear modification and subsequent filtering can be made smaller by a large factor. Even a factor of 5 is not unusual. The exact size of the improvement depends on the actual application and on the set of reinsertion factors that are used. In most applications, monotonously increasing reinsertion factors are assumed to be preferred. The re-insertion factors can for example be exponentially increasing with step number, but also other developments, such as parabolic, or linearly increasing reinsertion factors are believed to be of benefit. Non-monotonously increasing reinsertion factors, e.g. the use of groups of reinsertion factors of just two or three levels may be easy to implement. Also more elaborate schemes, such as a first step reinsertion factor less than one, or a last step reinsertion factor less than the second last may be found to be beneficial for certain applications. Also reinsertion factors that increase for each stage within parts of the n steps can also be of interest in certain applications. Furthermore, reinsertion factors exhibit a generally increasing trend over the n steps, however, not necessarily strictly increasing between each step may also be of use.

Figure 2:
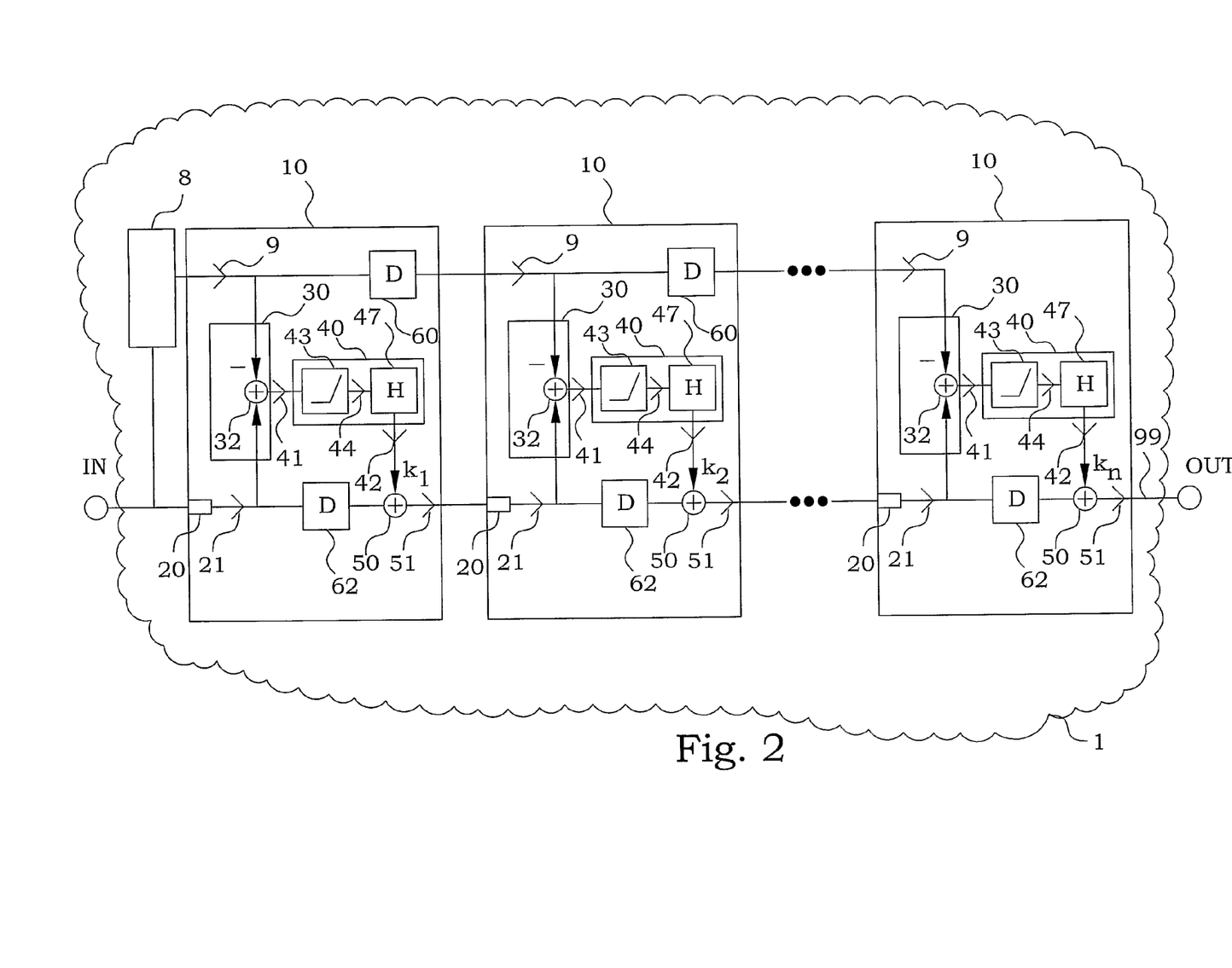
FIG. 2 is a block scheme of another embodiment of a non-linear signal conditioning device according to the present invention.

In another typical application, such as the embodiment shown in FIG. 2, the filtering is applied on a rectified difference between the desired non-linear signal and the processed signal as it emerges from the previous step. Here an input signal IN is provided to the first step as an input main signal 21. The input signal IN is also provided to a non-linear processing unit 8, creating a reference non-linear signal 9. This reference non-linear signal 9 is a desired signal that the output signal 99 should resemble, but without any constraints in bandwidth. The means 30 for providing an input insertion signal 41 is here connected to the non-linear processing unit 8 for receiving the reference non-linear signal 9, and to the input 20 for receiving the input main signal 21. The means 30 for providing an input insertion signal 41 comprises in the present embodiment a subtractor 32, providing a difference between the input main signal 21 and the reference non-linear signal 9. The subtractor can e.g. be implemented as in FIG. 2 as an adder of a negative reference non-linear signal 9. The difference is provided as the insertion source signal 41. The non-linear processing means 40 comprises in this embodiment a rectifier 43. In a general case, the rectifiers 43 need assistance from signal transforming parts to rotate the signals or extract the feature to be processed, for example amplitude. In a more general embodiment, the rectifier 43 can be a general non-linear processing with regard to a boundary. The rectifier 43 gives rise to a rectified signal 44, which is a non-band-limited insertion signal for the present embodiment. This signal 44 is then processed by a filter 47, giving rise to the processed insertion signal 42, which in turn is combined with the input main signal 21 in a combiner 50. The filters 47 can be low-pass, band-pass, multi-band, etc. depending on the application. Usually, the filters' passbands coincide largely with the input signal's or reference signal's main frequency range (or ranges).

In other words, the non-linear processing means 40 extracts a feature from the insertion source signal 41. The extracted feature is represented in the same scale as the input main signal 21 of respective step 10. When combining the treated signal with the input main signal 21, the reinsertion factor is applied. Anyone skilled in the art realizes that such application of the "reinsertion factor" can be performed anywhere in the step 10, and that there are many equivalent signal treatments. The factor can thus be introduced anywhere in the chain of the means 30 for providing the input insertion signal 41 and the non-linear processing means 40. It would also be possible to expose the input main signal itself and any reference signal for an "inverted" reinsertion factor and finally restore the desired scale of the output signal. The basic idea is, however, that the signals to be combined are expressed in different scales, differing by the factor expressed by the reinsertion factor.

The processing of the signals in the non-linear processing means 40 takes typically some time. Typically the main signal 21 therefore needs to be delayed for a corresponding amount of time for giving the intended signal when combined with the filtered signal. A delay unit 62 is in the present embodiment inserted between the input 20 and the combiner 50. The delays, D, thus delay the signal in the unfiltered branch so that it is in step with the one that go through the rectifier 43 and filter 47.

The invention can be implemented in a number of different ways. The input can be at radio frequency (RF), at an intermediate frequency, or at baseband. For analogue inputs, the rectifiers or limiters may be diode or transistor circuits and the filters and delays (discussed further below) may be made from active RC-filters or passive components such as capacitors and inductors or by piezo-coupled surface-wave processing. The input can also be digital, or digitised from an analogue input by an analogue-to-digital converter. The signal processing is then performed digitally, and the analogue output provided by a digital-to-analogue converter.

One example of an application that is very suitable to use the ideas of the present invention is in Peak-to-average ratio (PAR) reduction. This is also referred to as decresting or clipping. The present invention applied to PAR reduction increases efficiency and average output power of a Power Amplifier (PA). The objective of PAR reduction is to reduce the peak amplitude excursions of the output signal while keeping the spectrum expansion within specified limits. Such limits can be e.g. spectral mask and adjacent channel power ratio (ACPR) specifications. At the same time in-band errors should be kept within specified limits according to e.g. error vector magnitude (EVM) specifications.

Figure 3A:
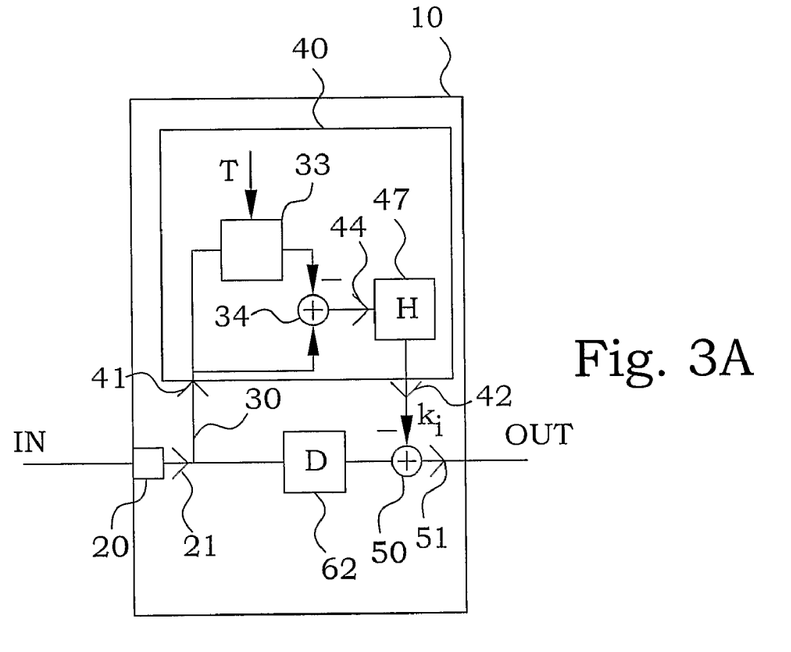
FIG. 3A is a block scheme of an embodiment of one step in a PAR reduction system according to the present invention.

An embodiment of one step 10 applicable in a PAR reduction system is illustrated in FIG. 3A. An input main signal 21 is as in previous examples provided via the input 20. In PAR reduction, the boundary is generally constant and only applied to the amplitude part of the complex or two-dimensional signal. Since the boundary is constant, there is no absolute need for any accompanying reference non-linear signal. Instead, the input main signal 21 is used as insertion source signal 41 and the means 30 for providing an input insertion signal 41 is here constituted by the connection between the input 20 and the non-linear processing means 40. An amplitude boundary level, T, comes directly from an offset level in a peak extractor 33, which in this application is comprised in the non-linear processing means 40. The offset level T is typically called "clipping level", "threshold" or "limit level". Such a difference is in the present embodiment provided by a subtractor 34. The non-band-limited insertion signal 44 is then connected to the filter 47 in analogy with earlier examples for providing the limitations in bandwidth.

The filtered, extracted peak signal 42 that is to be reinserted or combined with the main signal is in this embodiment inserted with a minus sign, i.e. the combiner 50 in this embodiment operates as a subtractor. In general, the minus sign can be implicit or explicit. Where in the processing to place this minus sign is a matter of finding the simplest, most efficient implementation.

In FIG. 3A, the minus sign is implemented by subtracting, illustrated by the minus sign on the input to the adder circuit.

Figure 3B:
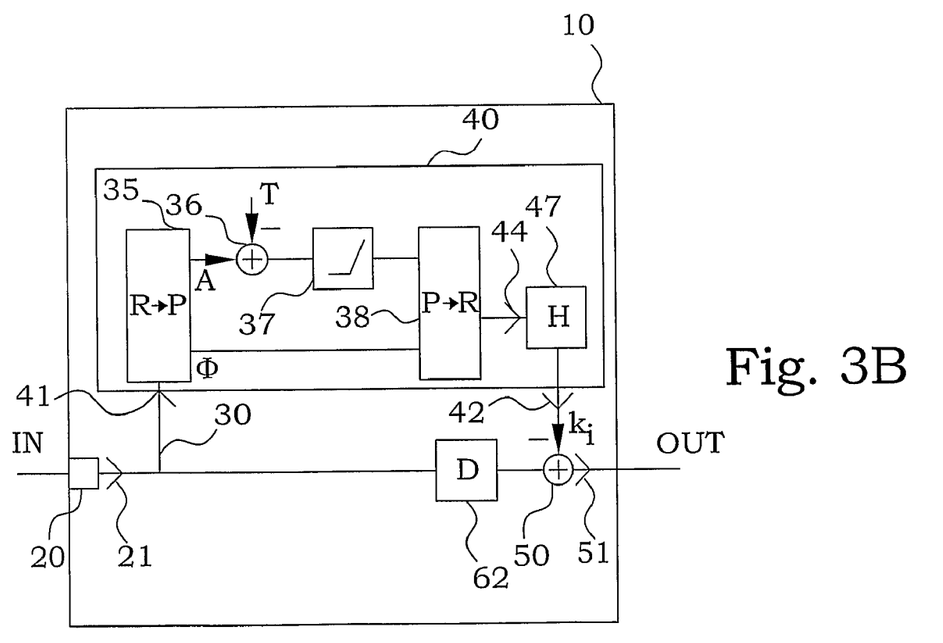
FIG. 3B is a block scheme of another embodiment of one step in a PAR reduction system according to the present invention.

FIG. 3B illustrates another embodiment of a single step of a PAR reduction system according to the present invention. The means 30 for providing an input insertion signal 41 is also here the connection between the input 20 and the non-linear processing means 40. The non-linear processing means 40 here calculates a non-band-limited input insertion signal 44 by, in a subtractor 36, subtracting a threshold level T from an amplitude A, obtained by a rectangular to polar conversion unit 35. The positive, i.e. rectified part, of this difference, obtained in a rectifier 37, is used, together with the original phase $\Phi$, as inputs to a polar to rectangular conversion unit 38. The output of this polar to rectangular conversion unit 38 is the extracted peak in the same format as the input signal.

Figure 4A:
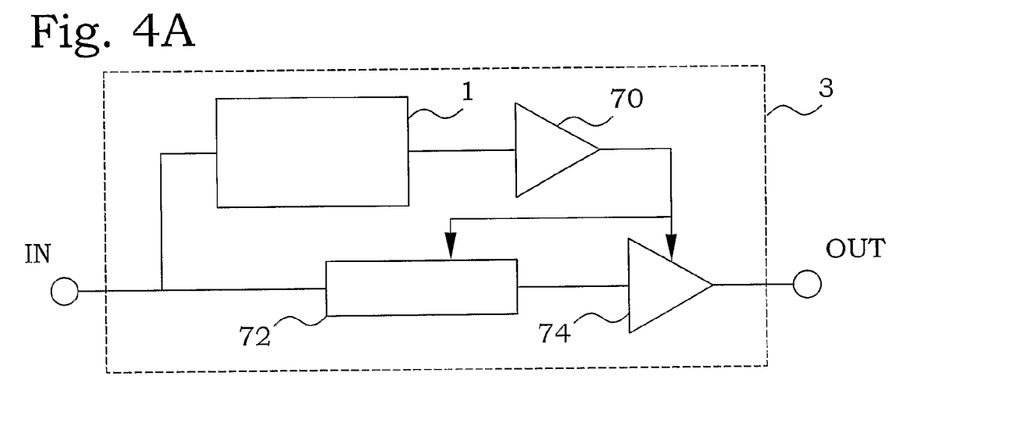
FIG. 4A is a block scheme of an embodiment of an envelope-elimination-and-restoration-like amplifier system in which the present invention can be applied.

The present invention can also be applied in e.g. power amplifier arrangements using dynamic drain bias, which results in an increased efficiency. A typical embodiment of a system 3 using dynamic drain bias is illustrated in FIG. 4A. An input signal is connected to a non-linear processing unit 1, in this embodiment an envelope signal unit, which preferably is configured according to the present invention. The envelope signal is typically amplified in an envelope amplifier 70. A dynamic compensator 72 processes the input signal to produce a signal to be amplified. The amplified envelope signal is used as drain voltage in an amplifier 74 for the signal to be amplified. The dynamic compensator 72 is in this embodiment preferably dynamically compensating the amplitude and phase of the signal to be amplified for variations in the envelope signal, to typically obtain a linearly amplified output signal. The objective with such a configuration is to keep the drain terminal voltage as little above the minimum needed, which is largely proportional to the envelope of the amplified signal, to maximise efficiency, while restricting its bandwidth. Thus, in an envelope signal application of the type described here above, the boundary is signal-amplitude dependent and typically one-sided. A lower bandwidth gives increased efficiency in the usually switch-mode drain voltage envelope amplifier.

Figure 4B:
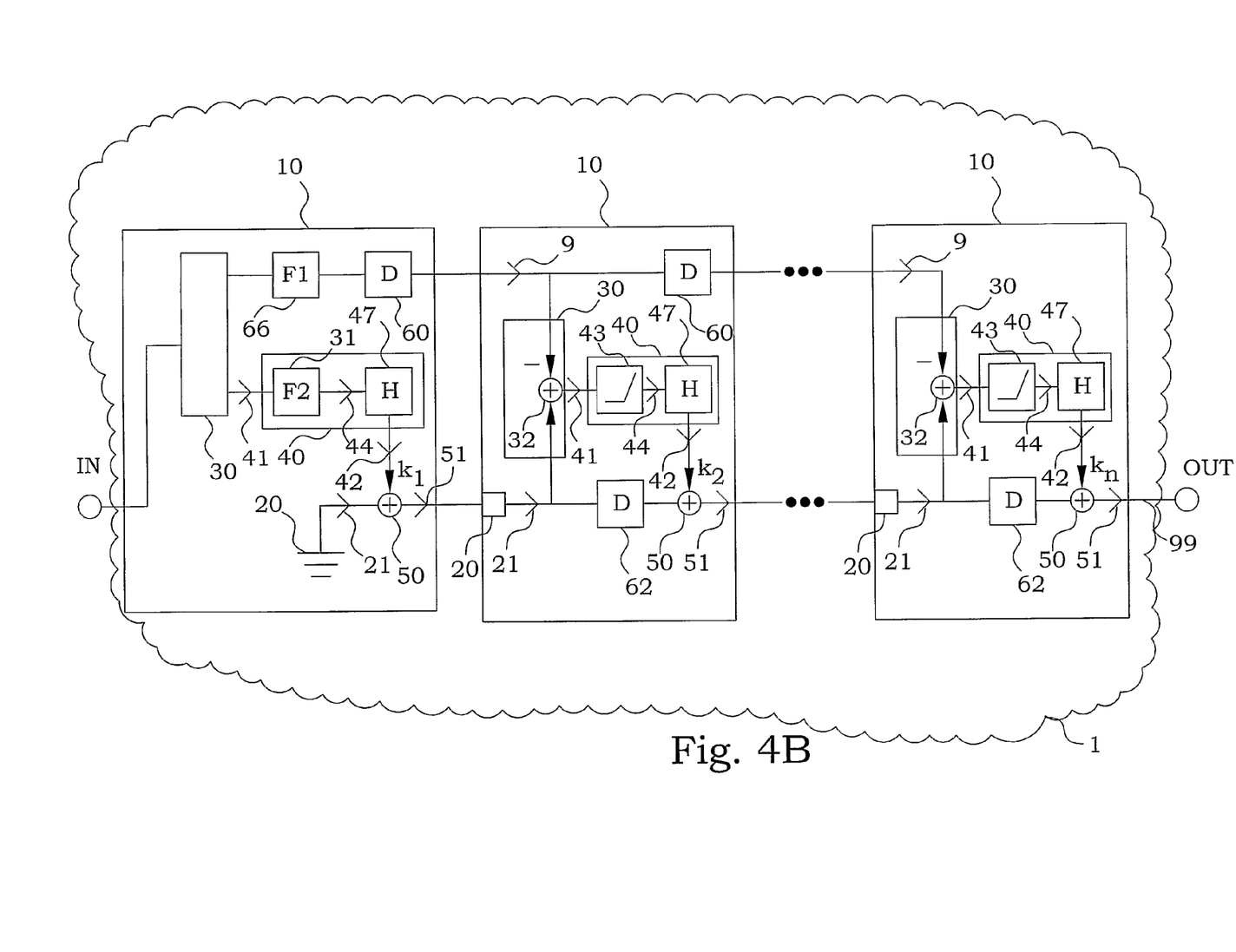
FIG. 4B is a block scheme of an embodiment of an envelope detector according to the present invention.

In FIG. 4B, an embodiment of an envelope signal unit 1 for use in a dynamic drain bias amplifier system 3 is illustrated. In this embodiment, the first step is somewhat different from the subsequent ones. In the first step, the input signal is connected to an envelope detector registering the true signal envelope. This envelope detector constitutes the means 30 for providing an input insertion signal 41 in this embodiment. The envelope signal 41 is provided to a processor 31, giving a signal that is a function F2 of the signal envelope 41. This function output signal thus constitutes the non-band-limited insertion signal 44 of the first step and operates as a seed signal to the rest of the arrangement. The non-band-limited insertion signal 44 is filtered in the filter 47. The input main signal 21 in this first step is a zero signal, whereby the means for providing an input main signal 20 is represented by a ground symbol. The (zero) main signal 21 is combined with the filtered function of the signal envelope 42 using a reinsertion factor $k_1$ in an adder 50 to give the output main signal 51 of the first step.

The envelope signal is furthermore connected to another processor 66 that produces a reference non-linear signal 9 as a function, F1, of the envelope of the input two-dimensional, complex, signal. This reference non-linear signal 9 is used in subsequent steps. In order to compensate for the processing time of the seed signal, the reference signal 9 is delayed a corresponding time in a delay unit 60.

In the subsequent steps, the processing will be somewhat different, more in analogy with the steps of the embodiment of FIG. 2 instead. The input main signal 21 is provided via the input 20 as in previous embodiments. A difference between the input main signal 21 and the reference signal 9 is provided as insertion source signal 41. However, in this embodiment, the input main signal 21 is subtracted from the reference signal 9, which then gives any undershooting signal parts as positive signals already from the start. The undershooting signals are then rectified 43 and filtered 47 in analogy with FIG. 2 and finally combined with the delayed main signal. However, since the filtered undershooting signal part here is a positive signal, the combiner 50 operates with a positive sign and with a suitable reinsertion factor.

Figure 4C:
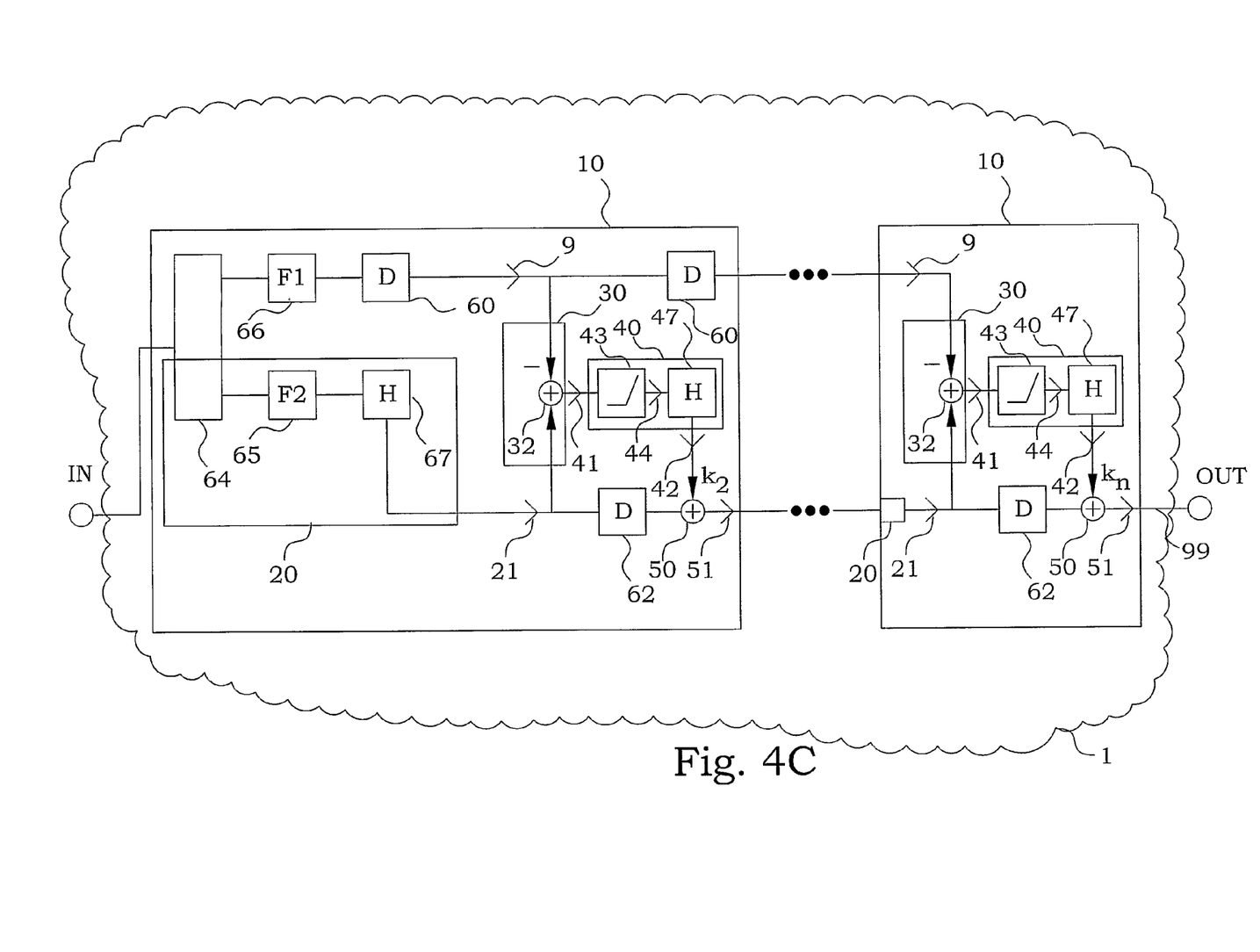
FIG. 4C is a block scheme of another embodiment of an envelope detector according to the present invention.

Since the input main signal in the first step of FIG. 4B is a trivial signal, the entire first step can instead be considered as being itself a means for providing an input main signal of the subsequent step. The situation can then be illustrated as in FIG. 4C. Here, at least a part of an envelope detector 64, a processor 65 and a filter 67 constitute the means for providing an input main signal 20. Any non-unity reinsertion factor can easily be incorporated in the processor 65. The rest of the set-up is equivalent to FIG. 4B, except for the numbering of the steps and reinsertion factors.

Figure 5:
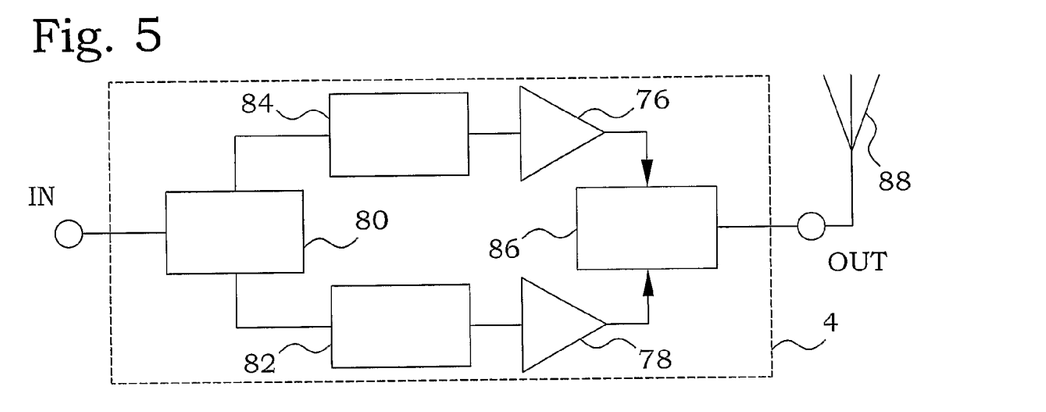
FIG. 5 is a block scheme of an embodiment of a Chireix amplifier system in which the present invention can be applied.

The present invention can also increase efficiency in Doherty and Chireix PA systems. An embodiment of a Chireix PA arrangement 4 is illustrated in FIG. 5. An input signal input 5 is connected to two power amplifiers 76, 78 via a control network. The control network of a Chireix amplifier 4 typically comprises a signal component separator 80, producing phase-modulated constant-amplitude signals. These signals are upconverted in filters 82, 84, before being amplified in the power amplifiers 1. A combiner network 86 combines the individual amplified signals into an output signal, provided to a load output, in this example connected to an antenna 88. The phases of these constant-amplitude signals are chosen so that the result from their vector-summation in the Chireix combiner network 86 yields the desired amplitude. All amplitudes from zero to full amplitude, as well as negative amplitudes, can be obtained in this way.

The flattened voltages at the amplifier drain terminals should exhibit minimal overshoots. Non-linear amplifier signals that fulfil this condition and stay within a limited bandwidth, and further increase efficiency, can be manufactured by using non-linear devices 82, 84 according to the present invention. A configuration and processing similar to that used in PAR reduction (FIG. 3A-B) can be used. The boundary is constant and applied to the amplitude of the complex signals. Since the boundary is constant, there is no need for an accompanying reference non-linear signal.

Figure 6:
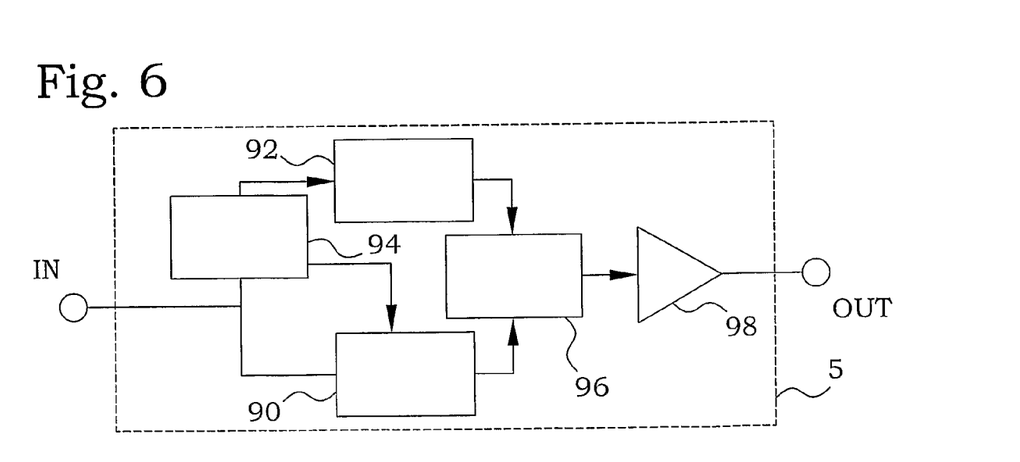
FIG. 6 is a block scheme of an embodiment of a dynamic bias amplifier system in which the present invention can be applied.

Dynamic Gate Bias systems are other applications for the ideas of the present invention. FIG. 6 illustrates one embodiment of a Dynamic Gate Bias system 5. An input signal provided to the system 5 is intended to be amplified and provided as a radio frequency output signal. The input signal is connected to an input detector 94, which is arranged to determine an instantaneous (envelope) size measure of the input signal. An output of the input detector 94 is connected to a bias signal generator 92, which generates a bias signal to be used for providing the actual amplification operation. The bias signal generator 92 can thus provide a bias signal dependent on the input signal. The bias signal generator typically also comprises a bias amplifier. A signal dependent on the input signal is provided as a drive signal. The drive signal and the bias signal are matched in a matching unit 96 and provided to an amplifier 98, e.g. a power transistor, performing the actual amplification according to the selected drive signal and bias signal. A pre-distortion unit 90 is connected to the input signal and an output of the input detector for enabling a suitable pre-distortion of the input signal, typically for providing a linear output signal. An output signal is thus provided. By selecting the pre-distortion and the bias in an appropriate manner dependent on the size of the input signal, an efficient amplification can be achieved.

The ideal gate bias to a power transistor 98 is generally a non-monotonous function of the input amplitude. Limitations in the driver amplifier's output power gives a strict boundary to the bias function, and bandwidth limitations in the bias generating and amplifying circuits put restrictions also on the bandwidth. By applying and modifying the techniques used for dynamic drain bias (FIGS. 4A-C), the bias signal generator 92 can provide signals giving a more efficient amplification.

Also here, starting with a seed signal that is a function, F2, of the input signal can be beneficial in the dynamic gate bias application.

Figure 8:
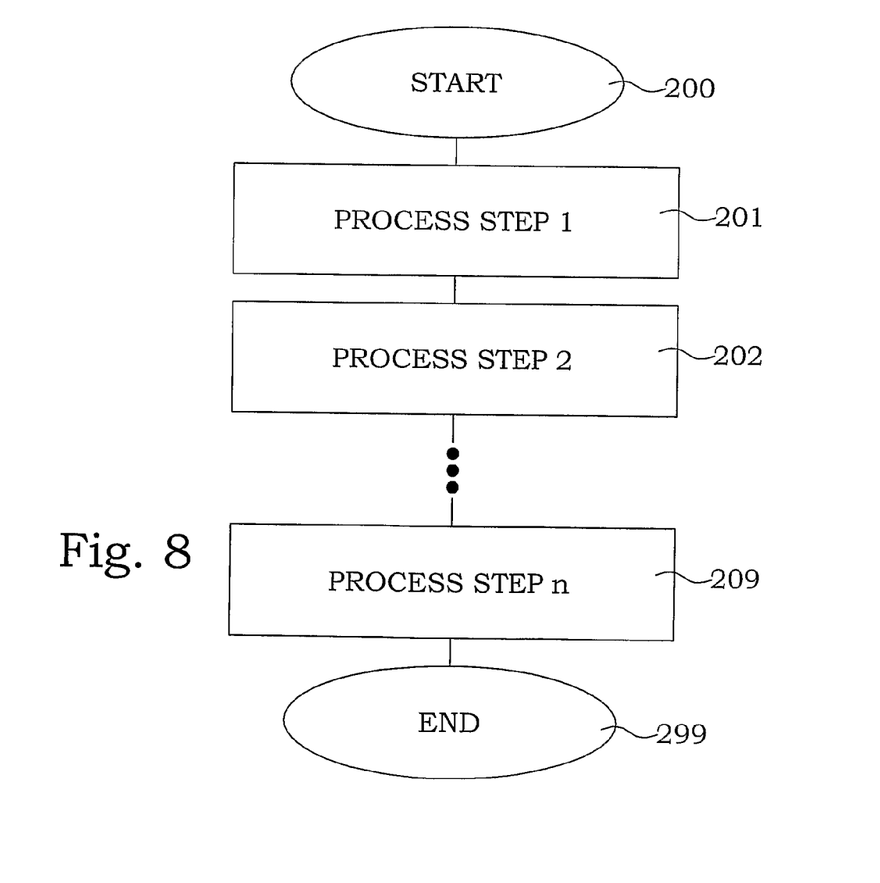
FIG. 8 is a flow diagram illustrating the main steps of an embodiment of a non-linear signal conditioning method.

FIG. 8 illustrates a flow diagram of an embodiment of a method according to the present invention employing non-linear processing of signals in consecutive steps. The method starts in section 200. In section 201, a first process step is performed using a reinsertion factor $k_1$. In section 202, a second process step is performed using a reinsertion factor $k_2$. The process continues until a last process step, step n, is performed in section 209, using a reinsertion factor $k_n$. The method ends in section 299. The reinsertion factors are according to the present invention such that at least one reinsertion factor is larger than a preceding reinsertion factor.

Figure 9:
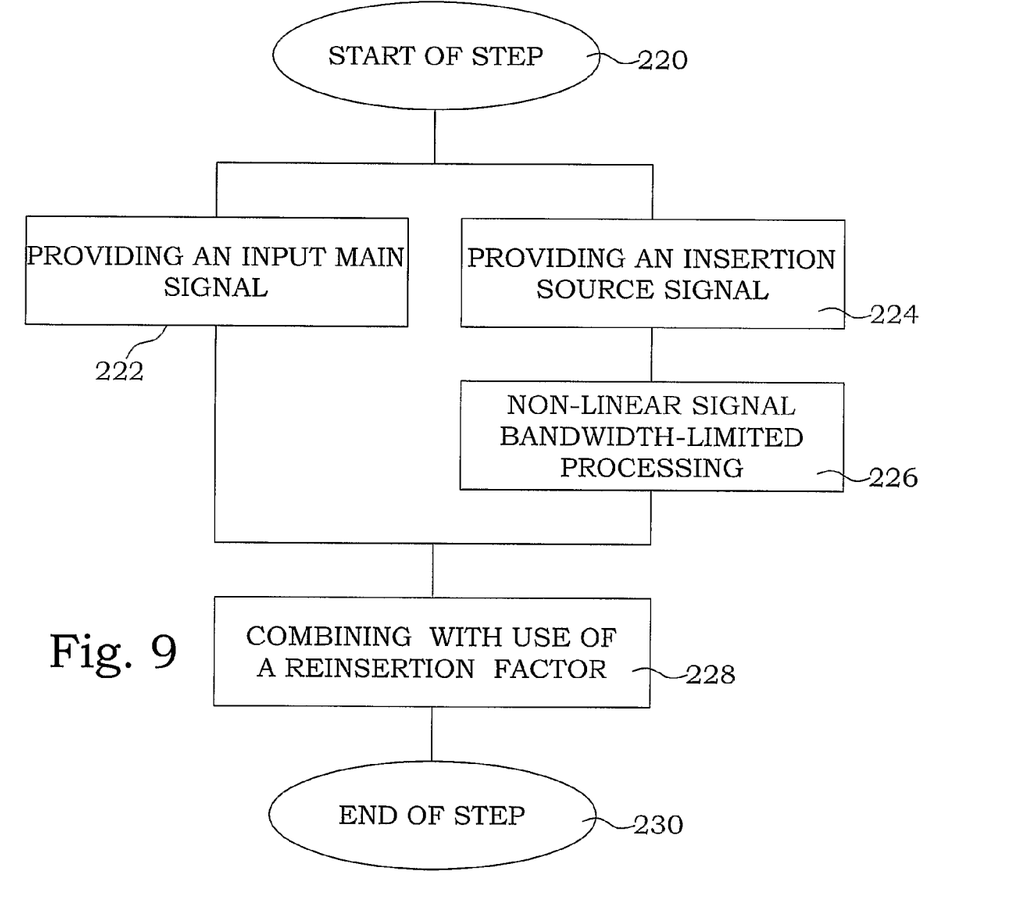
FIG. 9 is a flow diagram illustrating the main steps of an embodiment of one step of a multi-step non-linear signal conditioning method according to the present invention.

FIG. 9 illustrates a flow diagram of an embodiment of a method of a particular step in a method according to the present invention. The step process starts in section 220. In section 222 an input main signal is provided, typically as a pure unaltered input signal provided to the step, as a zero signal or dependent on an input signal in any other way. In section 224, an insertion source signal is provided. This signal could e.g. be a constant reference signal or a signal dependent on the input signal to the step. In section 226, the input insertion signal is non-linearly processed, typically comprising bandlimiting filtering. In section 228, the input main signal is combined with the filtered insertion signal using a reinsertion factor. The combination can be performed by equal signs or by opposite signs, depending on the actual configuration of the input insertion signal provision and provides an output signal from the step. The step process ends in section 230.

Figure 10:
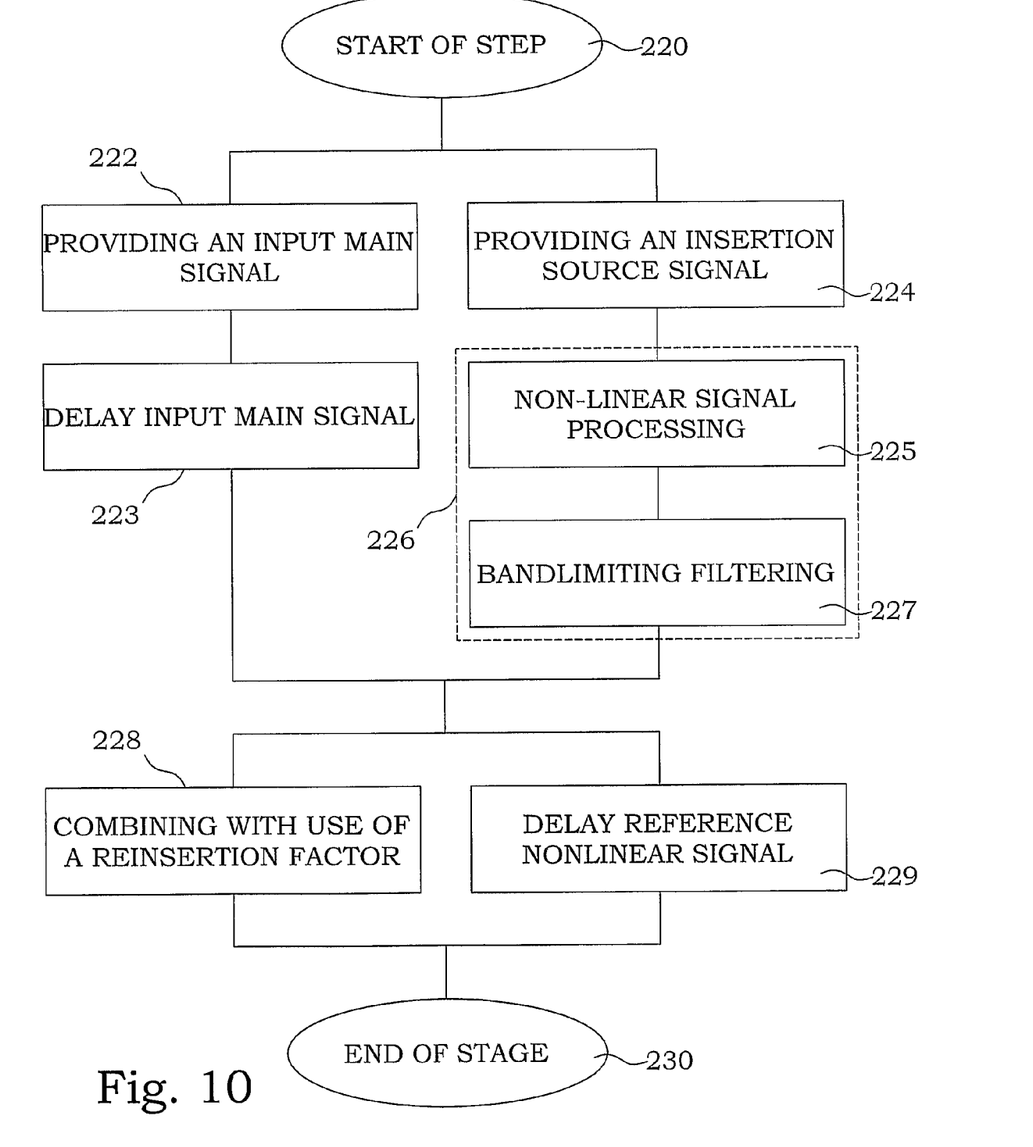
FIG. 10 is a flow diagram illustrating the main steps of another embodiment of one step of a multi-step non-linear signal conditioning method according to the present invention.

FIG. 10 illustrates another flow diagram of an embodiment of a method of a particular step in a method according to the present invention. The flow diagram resembles the one of FIG. 9, and corresponding steps are not further discussed. In FIG. 10, a section 223 is inserted, in which the input main signal is delayed for compensating of the time for processing the insertion signal. A section 229 is also included, which similarly delays any reference non-linear signal before it is provided to a next step, for compensating for any signal delays in the step. The section 226 is divided into two parts. Section 225 is a non-linear signal treatment without bandwidth constraints, while section 227 is a bandwidth-limiting filtering process.

The main advantage with the present invention is a large reduction in computational cost. The number of steps of non-linear modification and subsequent filtering can be smaller by a large factor. A factor of 5 is not unusual, depending on the performance requirements. Generally, the stricter requirements, the more steps are needed in the prior art scheme, and the more can be gained from using the present invention.

Using the present invention in PAR reduction, multi-carrier peak-to-average ratio can in very few steps be brought very close to the optimal while still satisfying ACPR, spectral mask and EVM specifications.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

International patent application WO 03/001697.

The invention claimed is:

1. A method for conditioning a signal into a desired signal, comprising non-linear signal processing in n steps, where $n \geq 2$;

each step of the n steps in turn comprising:
providing an input main signal;
providing an insertion source signal;
non-linear signal processing of the insertion source signal, giving a processed insertion signal representing an extracted feature from the insertion source signal, the extracted feature being represented in the same scale as the input main signal of respective step; and
combining a signal representative of the input main signal with the processed insertion signal multiplied by a reinsertion factor $(k_1-k_n)$ into an output main signal;
whereby the output main signal being the input main signal of a subsequent step; and
whereby the reinsertion factor $(k_2-k_n)$ of at least one of the n steps is larger than the reinsertion factor $(k_1-k_{n-1})$ of a preceding step.

2. The method according to claim 1, wherein the reinsertion factors $(k_1-k_n)$ increase for each step, at least within parts of the n steps.

3. The method according to claim 1 or 2, wherein the reinsertion factors $(k_1-k_n)$ exhibit a generally increasing trend over the n steps.

4. The method according to claim 1 or 2, wherein the reinsertion factor $(k_1-k_n)$ of each step except a first step of the n steps is larger than the reinsertion factor of a preceding step.

5. The method according to claim 1 or 2, wherein the reinsertion factor $(k_1-k_n)$ increases exponentially over the n steps.

6. The method according to claim 1 or 2, wherein the reinsertion factor of a last step $(k_n)$ of the n steps is equal to or larger than 2.

7. The method according to claim 1 or 2, wherein the non-linear signal processing operates under bandwidth or spectral mask restrictions.

8. The method according to claim 7, wherein the non-linear signal processing of the insertion source signal in turn comprises:
processing of the insertion source signal into a non-band restricted insertion signal; and
constraining a bandwidth of the non-band-restricted insertion signal giving the processed insertion signal.

9. The method according to claim 1 or 2, wherein the conditioning of the signal is a peak-to-average ratio reduction.

10. The method according to claim 9, wherein the providing of an insertion source signal in turn comprises providing a signal representative of the input main signal, whereby the non-linear signal processing comprises extraction of a part of the input main signal exceeding a predetermined amplitude.

11. The method according to claim 1 or 2, wherein the conditioning of the signal is comprised in overshoot control of drain voltages in Doherty or Chireix power amplifier systems.

12. The method according to claim 1 or 2, wherein the conditioning of the signal is comprised in supply voltage generation in an amplifier system using envelope elimination and restoration.

13. The method according to claim 12, further comprising providing a signal corresponding to a first function (F1) of an envelope of a radio frequency signal as a reference non-linear signal, whereby the providing of an insertion source signal in at least one step of the n steps is dependent on the reference non-linear signal.

14. The method according to claim 13, wherein the reference non-linear signal is delayed in each step to compensate for processing delays within respective step.

15. The method according to claim 13, wherein the providing of an insertion source signal in the at least one step in turn comprises providing of a difference between the input main signal and the reference non-linear signal as insertion source signal.

16. The method according to claim 15, wherein the non-linear signal processing of the insertion source signal in the at least one step further comprises rectifying of the insertion source signal.

17. The method according to claim 12, further comprising delaying the input main signal before combining to compensate for delays in the non-linear signal processing.

18. The method according to claim 12, wherein in a first step of said n steps the input main signal is a zero signal and the insertion source signal is a signal corresponding to a second function (F2) of the envelope.

19. The method according to claim 1, wherein the conditioning of the signal is comprised in conditioning of gate bias in a dynamic gate bias system.

20. A signal conditioning device, comprising:
means adapted to perform n steps on a signal, where n≧2;
the means adapted to perform n steps on a signal being interconnected such that an output main signal of one step being an input main signal of a subsequent step;
each step performed by the means for performing the n steps in turn comprising:
input means for the input main signal;
means for providing an insertion source signal;
non-linear signal processing means connected to the means for providing the insertion source signal, giving a processed insertion signal representing an extracted feature from the insertion source signal, the extracted feature being represented in the same scale as the input main signal of respective step; and
combiner, connected to the non-linear signal processing means and connected to receive a signal representative of the input main signal, arranged for combining the input main signal with the processed insertion signal multiplied by a reinsertion factor $(k_1\text{-}k_n)$ into the output main signal;
whereby the reinsertion factor $(k_2\text{-}k_n)$ of at least one of the n steps is larger than the reinsertion factor $(k_1\text{-}k_{n-1})$ of a preceding step.

21. The signal conditioning device according to claim 20, wherein the reinsertion factor $(k_2\text{-}k_n)$ of each step except a first step of the n steps is larger than the reinsertion factor $(k_1\text{-}k_{n-1})$ of a preceding step.

22. The signal conditioning device according to claim 20 or 21, wherein the reinsertion factor $(k_1\text{-}k_n)$ increases exponentially over the n steps.

23. The signal conditioning device according to claim 20 or 21, wherein the reinsertion factor $(k_n)$ of a last step of the n steps is equal to or larger than 2.

24. The signal conditioning device according to claim 20 or 21, wherein the non-linear signal processing means operates under bandwidth and spectral mask constraints.

25. The signal conditioning device according to claim 24, wherein the nonlinear signal processing means in turn comprises:
means for processing the insertion source signal into a non-band restricted insertion signal; and
filter for constraining a bandwidth of the non-band-restricted insertion signal giving the processed insertion signal.

26. The signal conditioning device according to claim 20 or 21, further incorporating a device for peak-to-average ratio reduction.

27. The signal conditioning device according to claim 26, wherein the means for providing an insertion source signal is a connection to the input means and wherein the non-linear processing means is arranged to extract a portion of the input main signal exceeding a predetermined amplitude (T).

28. The signal conditioning device according to claim 20 or 21 further comprising an amplifier system of a Doherty or Chireix type, having overshoot control means for drain voltages.

29. The signal conditioning device according to claim 20 or 21 further comprising an amplifier system using dynamic drain bias, having means for generation of supply voltage.

30. The signal conditioning device according to claim 29, wherein at least one step of the n steps further comprises a reference non-linear signal source, providing a signal corresponding to a first function (F1) of an envelope of a radio frequency signal, whereby the means for providing an insertion source signal is connected to an output of the reference non-linear signal source.

31. The signal conditioning device according to claim 30, further comprising a signal delay unit connected to the reference non-linear signal in each step to compensate for processing delays within respective step.

32. The signal conditioning device according to claim 30, wherein the means for providing an insertion source signal in the at least one step in turn comprises a subtractor connected to the input main signal and the reference non-linear signal, said subtractor being arranged to provide the insertion source signal.

33. The signal conditioning device according to claim 32, wherein the non-linear signal processing means in the at least one step further comprises a rectifier for the insertion source signal connected to a filter.

34. The signal conditioning device according to claim 29, further comprising delay means connected between the input means and the combiner for compensating delays in the non-linear signal processing means.

35. The signal conditioning device according to claim 29, wherein in a first step of said n steps, the input main signal is a zero signal and the insertion source signal is a signal corresponding to a second function (F2) of the envelope.

36. The signal conditioning device according to claim 20, further comprising a dynamic gate bias system having conditioning means of gate bias.

* * * * *